US006800500B2

(12) United States Patent
Coman et al.

(10) Patent No.: US 6,800,500 B2
(45) Date of Patent: Oct. 5, 2004

(54) III-NITRIDE LIGHT EMITTING DEVICES FABRICATED BY SUBSTRATE REMOVAL

(75) Inventors: Carrie Carter Coman, San Jose, CA (US); Fred A. Kish, Jr., San Jose, CA (US); Michael R Krames, Mt View, CA (US); Paul S Martin, Pleasanton, CA (US)

(73) Assignee: Lumileds Lighting U.S., LLC, San Jose, CA (US)

( * ) Notice: Subject to any disclaimer, the term of this patent is extended or adjusted under 35 U.S.C. 154(b) by 0 days.

(21) Appl. No.: 10/631,001

(22) Filed: Jul. 29, 2003

(65) Prior Publication Data

US 2004/0077114 A1 Apr. 22, 2004

Related U.S. Application Data

(62) Division of application No. 09/245,503, filed on Feb. 5, 1999.

(51) Int. Cl.[7] .............................................. H01L 21/20
(52) U.S. Cl. ........................... 438/22; 438/33; 438/455; 438/464
(58) Field of Search ..................... 438/22–47, 479–503, 438/455–464

(56) References Cited

U.S. PATENT DOCUMENTS

| 4,243,996 A | 1/1981 | Lebailly et al. ............... 357/17 |
| 5,390,210 A | 2/1995 | Fouquet et al. ............... 372/92 |
| 5,496,766 A | 3/1996 | Amano et al. ............... 437/127 |
| 5,804,834 A | 9/1998 | Shimoyama et al. ......... 257/22 |
| 5,821,571 A | 10/1998 | Lebby et al. .................. 257/98 |

(List continued on next page.)

FOREIGN PATENT DOCUMENTS

| DE | 195 11 415 A1 | 3/1995 |
| DE | 197 15 572 A1 | 4/1997 |
| DE | 199 45 465 A1 | 9/1999 |
| EP | 0 051 172 A1 | 10/1981 |
| EP | 0 444 630 A1 | 2/1991 |
| EP | 0 860 913 A3 | 8/1998 |
| FR | 2 423 869 | 4/1978 |
| GB | 2307 791 A | 6/1997 |

OTHER PUBLICATIONS

Handbook of Chemistry and Physics, 1976–1977; CRC Press, 57th Ed., pp. B47–B–48.
Ng, Complete Guide to Semiconductor Devices, 1995, pp. 392–393.
J.J. Dudley, D.I. Babic, R. Mirin, L. Yang, B.I. Miller, R.J. Ram, T. Reynolds, E.L. Hu, and J.E. Bower, "Low Threshold, Wafer Fused Long Wavelength Vertical Cavity Lasers", Applied Physics Letters 64 (12), pp. 1463–1465.
English language abstract of DE19945465, 1 page.
English language abstract of EP0051172, B1, 1 page.

*Primary Examiner*—Savitri Mulpuri
(74) *Attorney, Agent, or Firm*—Patent Law Group LLP (57) ABSTRACT

A III-nitride light-emitting structure including a p-type layer, an n-type layer, and a light emitting layer is grown on a growth substrate. The III-nitride light-emitting structure is wafer bonded to a host substrate, then the growth substrate is removed. In some embodiments, a first electrical contact and first bonding layer are formed on the III-nitride light-emitting structure. A second bonding layer is formed on the host substrate. In such embodiments, wafer bonding the III-nitride light emitting structure to the host substrate comprises bonding the first bonding layer to the second bonding layer. After the growth substrate is removed, a second electrical contact may be formed on a side of the III-nitride light-emitting device exposed by removal of the growth substrate.

14 Claims, 5 Drawing Sheets

U.S. PATENT DOCUMENTS

| | | | | |
|---|---|---|---|---|
| 5,837,561 A | * | 11/1998 | Kish et al. | 438/47 |
| 5,838,707 A | | 11/1998 | Ramdani et al. | 372/45 |
| 5,862,167 A | | 1/1999 | Sassa et al. | 372/45 |
| 5,952,681 A | | 9/1999 | Chen | 257/89 |
| 5,985,687 A | | 11/1999 | Bowers et al. | 438/46 |
| 6,033,927 A | * | 3/2000 | Shibata et al. | 438/33 |
| 6,071,795 A | * | 6/2000 | Cheung et al. | 438/458 |
| 6,100,104 A | * | 8/2000 | Haerle | 438/33 |
| 6,104,044 A | | 8/2000 | Iyechika et al. | 257/103 |
| 6,110,277 A | | 8/2000 | Braun | 117/94 |
| 6,111,272 A | | 8/2000 | Heinen | 257/94 |
| 6,136,623 A | * | 10/2000 | Hofstetter et al. | 438/28 |
| 6,153,010 A | | 11/2000 | Kiyoku et al. | 117/95 |
| 6,156,584 A | * | 12/2000 | Itoh et al. | 438/33 |
| 6,194,743 B1 | | 2/2001 | Kondoh et al. | 257/94 |
| 6,277,696 B1 | * | 8/2001 | Carey et al. | 438/289 |
| 6,291,839 B1 | | 9/2001 | Lester | 257/91 |
| 6,376,269 B1 | | 4/2002 | Chan et al. | 438/29 |
| 6,420,199 B1 | * | 7/2002 | Coman et al. | 438/22 |
| 6,559,075 B1 | * | 5/2003 | Kelly et al. | 438/795 |

* cited by examiner

III-NITRIDE LIGHT EMITTING DEVICES FABRICATED BY SUBSTRATE REMOVAL

CROSS REFERENCE TO RELATED APPLICATIONS

This application is a division of application Ser. No. 09/245,503, filed Feb. 5, 1999 and incorporated herein by reference.

BACKGROUND

1. Field of Invention

The present invention relates generally to the field of semiconductor optical emission devices, more particularly to a method for fabricating highly efficient and cost effective InAlGaN devices.

2. Description of Related Art

Sapphire has proven to be the preferred substrate for growing high efficiency InAlGaN light emitting devices because of its stability in the high temperature ammonia atmosphere of the epitaxial growth process. However, sapphire is an electrical insulator with poor thermal conductivity resulting in unusual and inefficient device designs. A typical LED structure grown on sapphire has two top side electrical contacts and a semitransparent metal layer to spread current over the p-contact. This contrasts with the standard vertical structure for current flow in LEDs grown on conducting substrates such as GaAs or GaP in which an electrical contact is on the top side of the semiconductor device and one is on the bottom. The two top side contacts on the sapphire based LED reduce the usable light emitting area of the device.

Furthermore, the low conductivity of the p-type InAlGaN layer results in the need for a semitransparent metal layer to spread current over the p-type semiconducting layer. The index of refraction of the sapphire (n~1.7) is also lower than that of the InAlGaN layers (n~2.2–2.6) grown upon it. Consequently, this mismatch in index of refraction (with the Sapphire being lower) results in waveguiding of the light between the absorbing semitransparent p-side current-spreading metallization and the sapphire. This results in absorption of 10–70% of the light generated in commercial InAlGaN device by the semitransparent metal layer.

Wafer bonding can be divided into two basic categories: direct wafer bonding, and metallic wafer bonding. In direct wafer bonding, the two wafers are fused together via mass transport at the bonding interface. Direct wafer bonding can be performed between any combination of semiconductor, oxide, and dielectric materials. It is usually done at high temperature (>400° C.) and under uniaxial pressure. One suitable direct wafer bonding technique is described by Kish, et al, in U.S. Pat. No. 5,502,316. In metallic wafer bonding, a metallic layer is deposited between the two bonding substrates to cause them to adhere. This metallic layer may serve as an ohmic contact to either the active device, the substrate or both. One example of metallic bonding is flip-chip bonding, a technique used in the micro- and optoelectronics industry to attach a device upside down onto a substrate. Since flip-chip bonding is used to improve the heat sinking of a device, removal of the substrate depends upon the device structure and conventionally the only requirements of the metallic bonding layer are that it be electrically conductive and mechanically robust.

A vertical cavity optoelectronic structure is defined to consist of an active region that is formed by light emitting layers interposing confining layers that may be doped, undoped, or contain a p-n junction. The structure also contains at least one reflective minor that forms a Fabry-Perot cavity in the direction normal to the light emitting layers. Fabricating a vertical cavity optoelectronic structure in the GaN/In$_x$Al$_y$Ga$_z$N/Al$_x$Ga$_{1-x}$N (where x+y+z=1.0) material systems poses challenges that set it apart from other Ill-V material systems. It is difficult to grow In$_x$Al$_y$Ga$_z$N structures with high optical quality. Current spreading is a major concern for In$_x$Al$_y$Ga$_z$N devices. Lateral current spreading in the p-type material is ~30 times less than that in the n-type material. Furthermore, the low thermal conductivity of the substrates adds complexity to the device design, since the devices should be mounted p-side down for optimal heat sinking.

One vertical cavity optoelectronic structure, e.g. a vertical cavity surface emitting laser (VCSEL), requires high quality mirrors, e.g. 99.5 % reflectivity. One method to achieve high quality mirrors is through semiconductor growth techniques. To reach the high reflectivity required of distributed Bragg reflectors (DBRs) suitable for VCSELs (>99 %), there are serious material issues for the growth of semiconductor In$_x$Al$_y$Ga$_z$N DBRs, including cracking and dopant incorporation. These mirrors require many periods/layers of alternating indium aluminum gallium nitride compositions (In$_x$Al$_y$Ga$_z$N/In$_{x'}$Al$_{y'}$Ga$_{z'}$N). Dielectric DBRs (D-DBR), in contrast to semiconductor DBRs, are relatively straightforward to make with reflectivities in excess of 99 % in the spectral range spanned by the In$_x$Al$_y$Ga$_z$N system. These mirrors are typically deposited by evaporation or sputter techniques, but MBE (molecular beam epitaxial) and MOCVD (metal-organic chemical vapor deposition) can also be employed. However, only one side of the active region can be accessed for D-DBR deposition unless the host substrate is removed. Producing an In$_x$Al$_y$Ga$_z$N vertical cavity optoelectronic structure would be significantly easier if it was possible to bond and/or deposit D-DBRs on both sides of a In$_x$Al$_y$Ga$_z$N active region.

In "Low threshold, wafer fused long wavelength vertical cavity lasers", Applied Physics Letters, Vol. 64, No. 12, 1994, pp. 1463–1465, Dudley, et al. taught direct wafer bonding of AlAs/GaAs semiconductor DBRs to one side of a vertical cavity structure while in "Room-Temperature Continuous-Wave Operation of 1.430 μm Vertical-Cavity Lasers", IEEE Photonics Technology Letters, Vol. 7, No. 11, November 1995, Babic, et al. taught direct wafer bonded semiconductor DBRs to both sides of an InGaAsP VCSEL to use the large refractive index variations between AlAs/GaAs. As will be described, wafer bonding D-DBRs to In$_x$Al$_y$Ga$_z$N is significantly more complicated than semiconductor to semiconductor wafer bonding, and was not known previously in the art.

In "Dielectrically-Bonded Long Wavelength Vertical Cavity Laser on GaAs Substrates Using Strain-Compensated Multiple Quantum Wells," IEEE Photonics Technology Letters, Vol. 5, No. 12, December 1994, Chua et al. disclosed AlAs/GaAs semiconductor DBRs attached to an InGaAsP laser by means of a spin-on glass layer. Spin-on glass is not a suitable material for bonding in a VCSEL between the active layers and the DBR because it is difficult to control the precise thickness of spin on glass, and hence the critical layer control needed for a VCSEL cavity is lost. Furthermore, the properties of the spin-on glass may be inhomogeneous, causing scattering and other losses in the cavity.

Optical mirror growth of Al$_x$Ga$_{1-x}$N/GaN pairs of semiconductor DBR mirrors with reflectivities adequate for VCSELs, e.g. >99%, is difficult. Theoretical calculations of reflectivity suggest that to achieve the required high reflectivity, a high index contrast is required that can only be provided by increasing the Al composition of the low-index $Al_xGa_{1-x}N$ layer and/or by including more layer periods (material properties taken from Ambacher et al., MRS Internet Journal of Nitride Semiconductor Research, 2(22) 1997). Either of these approaches introduces serious challenges. If current will be conducted through the DBR layers, it is important that the DBRs be conductive. To be sufficiently conductive, the $Al_xGa_{1-x}N$ layer must be adequately doped. Dopant incorporation is insufficient unless the Al composition is reduced to below 50% for Si (n-type) doping and to below 17% for Mg (p-type) doping. However, the number of layer periods needed to achieve sufficient reflectivity using lower Al composition layers requires a large total thickness of $Al_xGa_{1-x}N$ material, increasing the risk of epitaxial layer cracking and reducing compositional control. Indeed, an $Al_{0.30}Ga_{0.70}N$/GaN stack~2.5 $\mu$m thick is far from sufficiently reflective for a VCSEL. Thus, a high reflectivity DBR based on this layer pair requires a total thickness significantly greater than 2.5 $\mu$m and would be difficult to grow reliably given the mismatch between AlN and GaN growth temperatures. Even though the cracking is not as great of an issue if the layers are undoped, compositional control and the AlN/GaN growth temperatures still pose great challenges to growing high reflectivity DBRs. Hence, even in applications where the DBRs do not have to conduct current, mirror stacks with reflectivities>99% in the $In_xAl_yGa_zN$ material system have not been demonstrated. For this reason, dielectric-based DBR mirrors are preferred.

Semiconductor devices are manufactured many thousands to tens of thousands at a time on wafers. The wafers must be diced into individual die prior to packaging. If sapphire is used as the growth substrate one must thin and dice the sapphire substrate. The hardness and hexagonal crystal structure of sapphire make the dicing operation difficult and expensive.

SUMMARY

In accordance with embodiments of the invention, a III-nitride light-emitting structure including a p-type layer, an n-type layer, and a light emitting layer is grown on a growth substrate. The III-nitride light-emitting structure is wafer bonded to a host substrate, then the growth substrate is removed. In some embodiments, a first electrical contact and first bonding layer are formed on the III-nitride light-emitting structure. A second bonding layer is formed on the host substrate. In such embodiments, wafer bonding the III-nitride light emitting structure to the host substrate comprises bonding the first bonding layer to the second bonding layer. After the growth substrate is removed. The host substrate is selected from a group of materials including silicon, germanium, glass, copper, and gallium arsenide, a second electrical contact may be formed on a side of the III-nitride light-emitting device exposed by removal of the growth substrate.

DESCRIPTION OF THE DRAWINGS

FIGS. 4A–D illustrate a preferred method for dicing InAlGaN light-emitting devices. In FIG. 4A, InAlGaN layers grown on a sapphire substrate are coated with ohmic contact and bonding layers, wherein the first bonding layer is selected from a group of metals including silver, nickel, aluminum, gold, and cobalt. In FIG. 4B, a host substrate is bonded to the InAlGaN layers prior to removal of the sapphire substrate. In FIG. 4C, the InAlGaN devices are defined by mesa etching through the InAlGaN device. In FIG. 4D, devices are finally singulated by dicing the host substrate.

DETAILED DESCRIPTION

This invention is concerned with building vertically conducting InAlGaN light emitting devices defined as devices in which the ohmic contacts to the InAlGaN device layers are on opposite sides, top & bottom, of the InAlGaN device layers.

Figure 1:
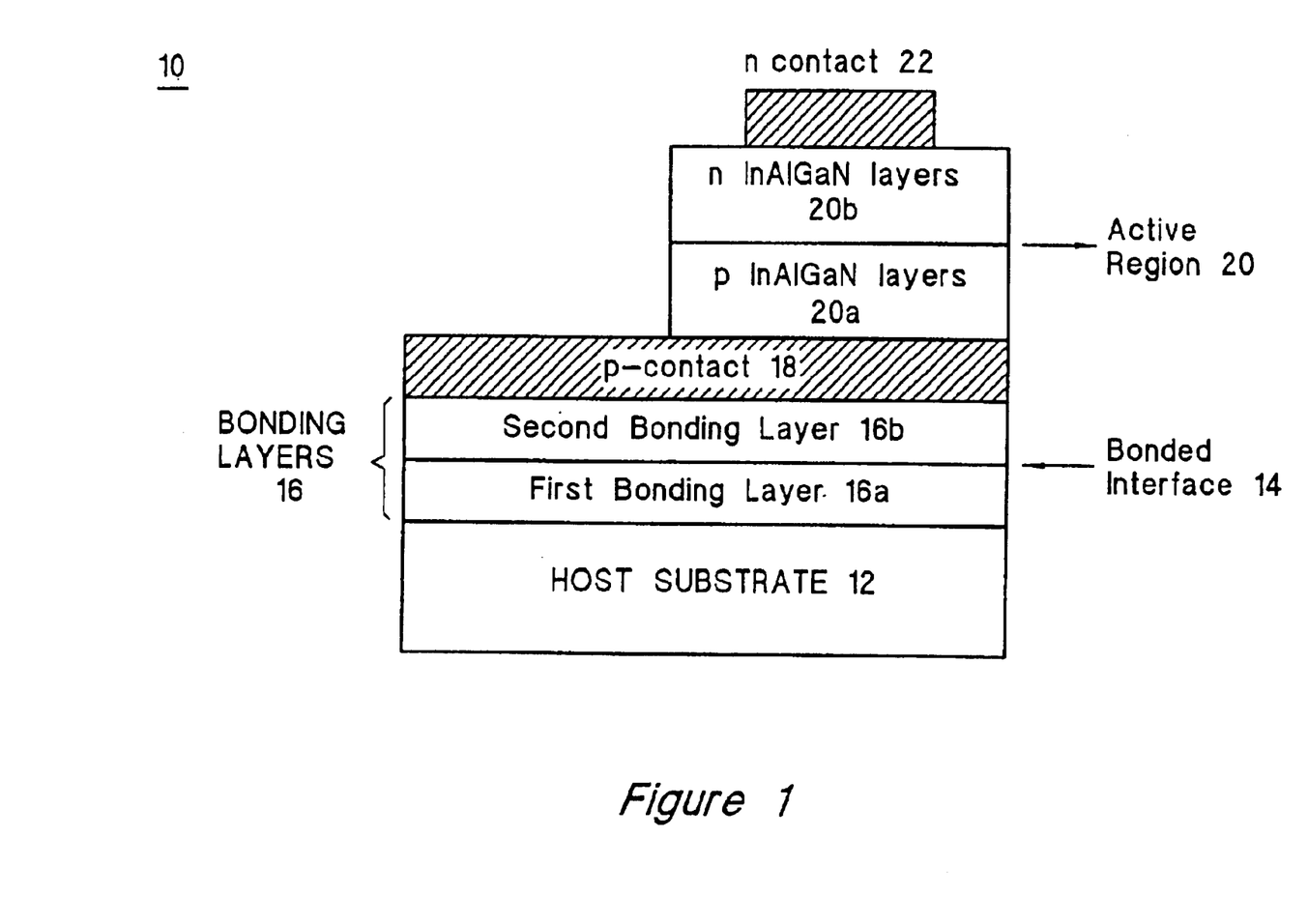
FIG. 1 illustrates a preferred embodiment of an InAlGaN light-emitting device with a bonding layer comprised of ohmic contact layers to the InAlGaN heterostructure and adhesion layers to the host substrate.

One preferred structure according to the present invention is shown in FIG. 1. Initially, an InAlGaN light emitting device 10 is grown on a sacrificial growth substrate 30 such as sapphire. The structure is grown with the p-type layer 20a exposed. A reflective ohmic contact 18 is deposited on top of the p-type InAlGaN layers 20a. The InAlGaN structure is then bonded to a host substrate 12 by means of bonding layers 16 interposing the InAlGaN light emitting layers 20 and the host substrate 12. The bonding layer 16 materials are chosen to provide a strong mechanical bond and to be electrically conductive. In general, the bonding layer includes a plurality of layers, the first bonding layer 16a that is deposited on the InAlGaN device layers and the second bonding layer 16b that is deposited on the host substrate. The bonding layers 16 are deposited by any number of means known in the prior art, such as electron-beam evaporation, sputtering, and electro-plating. After bonding, the sacrificial sapphire growth substrate 30 is removed via one of many substrate removal techniques as known in the prior art such as laser melting, mechanical polishing, and chemical etching of sacrificial layers. Then the InAlGaN layers are patterned, etched, and contacted to provide for an electrical injection light emitting device. The bonding layer serves as a low resistivity current spreading layer, an ohmic contact to the p-InAlGaN layers, and an adhesion layer to the host substrate.

Figure 2:
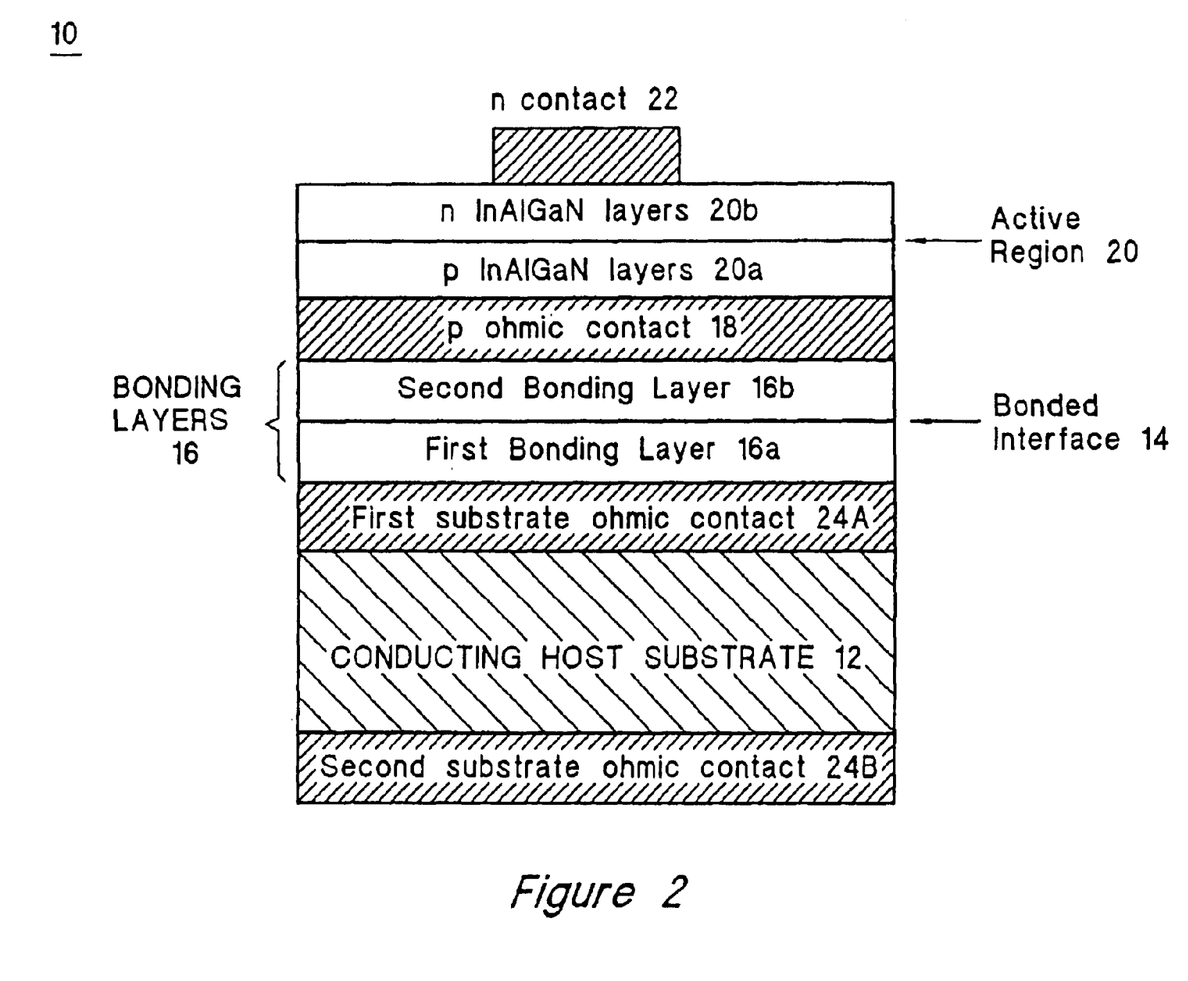
FIG. 2 illustrates a preferred embodiment of an InAlGaN light-emitting device with a bonding layer comprised of ohmic contact layers to the InAlGaN heterostructure and also ohmic contact layers to an electrically conducting host substrate.

Another preferred embodiment is shown in FIG. 2. As in FIG. 1, InAlGaN light-emitting device layers are grown atop a sacrificial substrate 30 and a reflective ohmic contact 18 is deposited on top of the exposed p-type layer 20a. Now, the InAlGaN structure 20+18 is bonded to a host substrate 12 that is electrically conductive via bonding layers 16. This substrate may be a semiconductor or metal. In the case of a semiconductor substrate, the bonding layer must be adjacent or comprised of ohmic contact layers to the substrate 24a, and a second ohmic contact 24b is applied to the side of the substrate opposite the bonded interface 14. After attaching the host substrate, the sacrificial growth substrate is removed and an n-type ohmic contact 22 is provided to the n-InAlGaN layers. As a result, a vertically conductive InAlGaN light-emitting device is achieved. This device exhibits excellent current spreading due to the low resistitivity of the semiconductor or metal host substrate resulting in low forward voltage and high electrical to optical conversion efficiency. In addition, because there is only a single ohmic contact on the top of the device and none of the active region of the device is removed during the fabrication of the second ohmic contact to the device, more than 75% of the available active region is preserved for unblocked light emission compared to less than 40% in commercially available devices.

Figure 3:
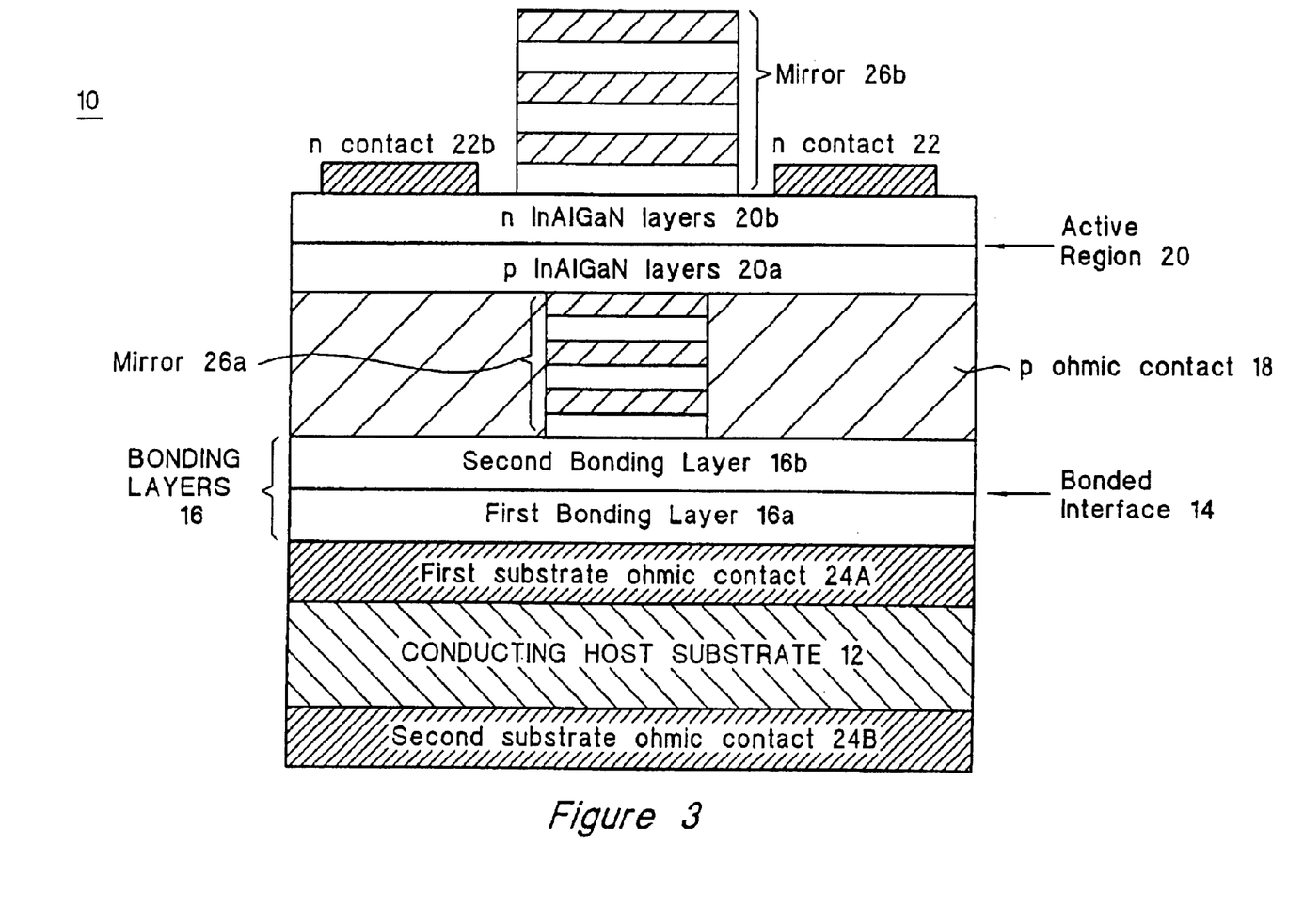
FIG. 3 illustrates a preferred embodiment of an InAlGaN light-emitting device with opposing distributed Bragg reflector (DBR) mirror stacks on either side of the light emitting layers to form a vertical cavity device. The bonding layer is comprised of ohmic contact layers to the InAlGaN heterostructure and also ohmic contact layers to an electrically conducting host substrate.
Figure 4A:
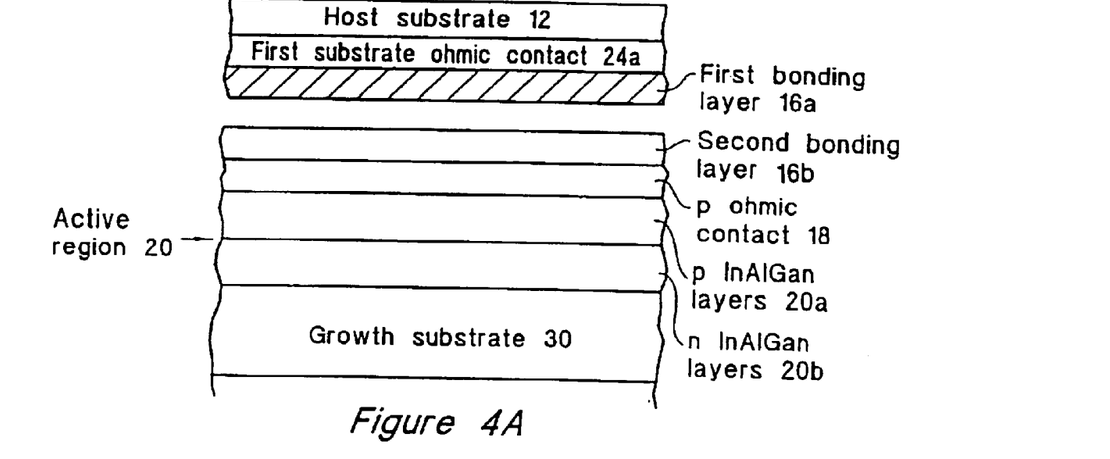
Figure 4B:
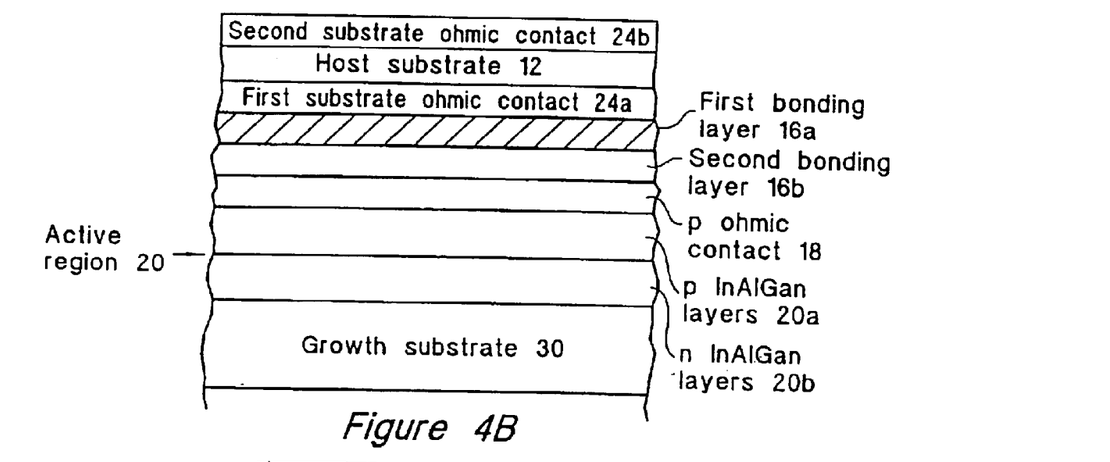
Figure 4C:
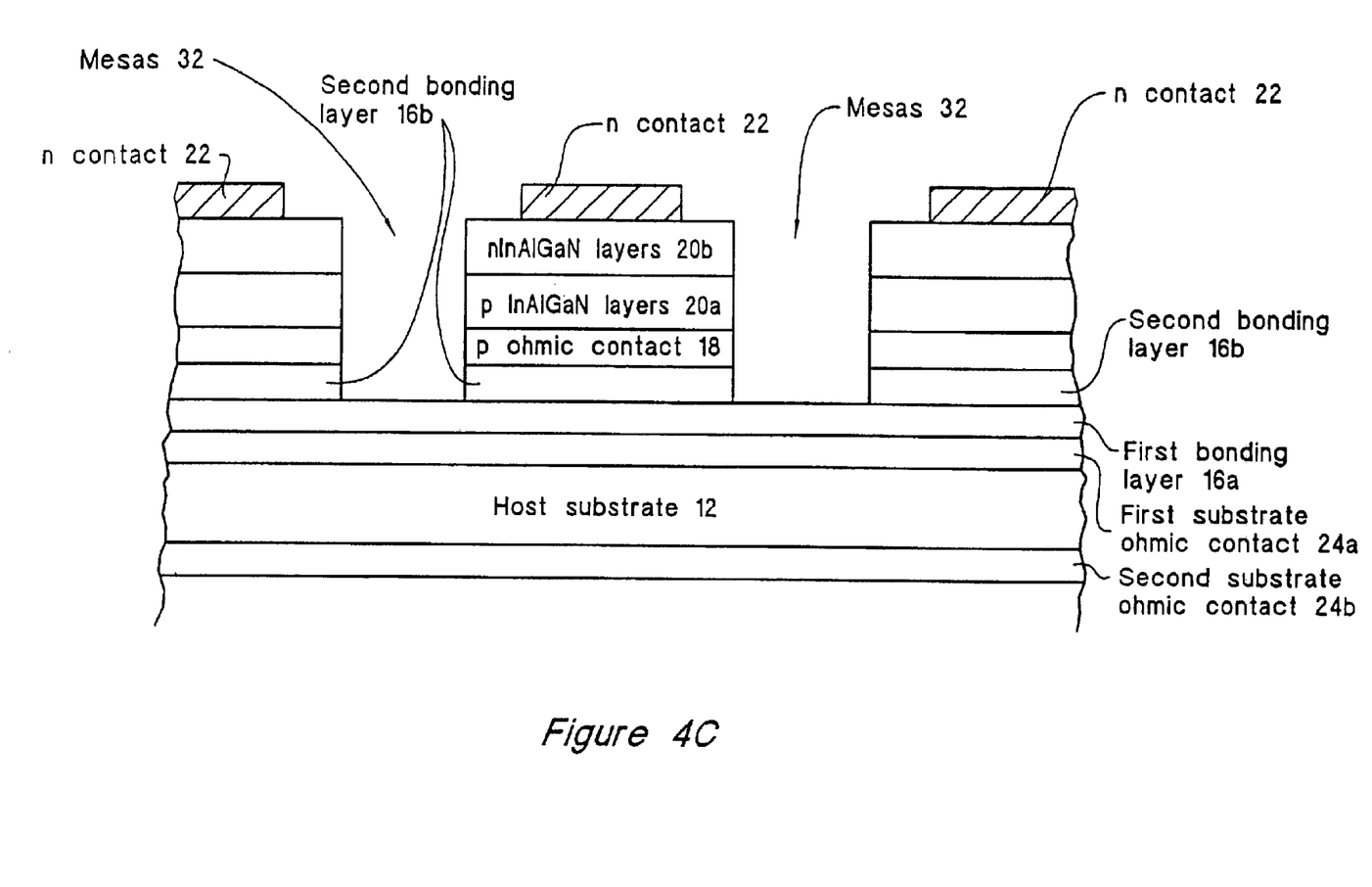
Figure 4D:
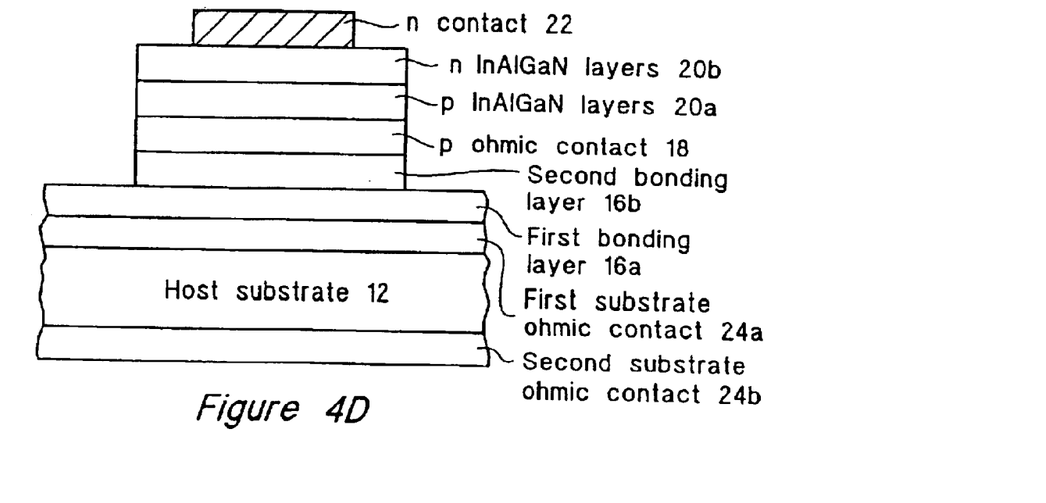

Another preferred embodiment is shown in FIG. 3. In this case, a DBR mirror stack 26a is deposited adjacent to the p-InAlGaN layer 20a in addition to the p-side ohmic contacts 18. The mirror stack can consist of one or more of the following materials: dielectric, semiconductor and metal. The structure is bonded to a host substrate 12 via bonding layers 16 which provide adhesion to the host substrate 12 and electrical contact to the p-side ohmic 18 contact metals. The bonding layer 16 material and thickness should be chosen to avoid compromising the DBR mirror stack reflectivity during the attachment of the host substrate. After removal of the sacrificial growth substrate 30, a second DBR mirror stack 26b is deposited on the InAlGaN vertical cavity optoelectronic structure on the side opposing the first mirror stack 26a. The optional second mirror stack 26b is patterned and etched to provide areas for n-type ohmic contacts 22. For a vertical cavity surface emitting laser, the mirrors must have very high reflectivity >99%. For a resonant cavity LED, the reflectivity requirement of the mirror(s) is relaxed (>60%). The first and second substrate ohmic contacts 24a, 24b provide for a vertically conductive device.

A preferred method for fabricating InAlGaN light-emitting devices is shown in FIG. 4. FIG. 4a shows InAlGaN light emitting layers 20a and 20b grown on a growth substrate 30 with a reflective ohmic silver contact 18 deposited on top of the p-type InAlGaN layer. Silver is preferred for the p-type ohmic contact because of its high reflectivity to the wavelengths of light typically emitted from an InAlGaN light-emitting device and for its low contact resistance to p-type InAlGaN. Alternatively, for devices in which the InAlGaN layers are grown with the n-type layer furthest from the sapphire growth substrate, aluminum is an excellent choice for an ohmic metal since it also has high reflectivity in the visible wavelength region of light typically emitted by InAlGaN devices and also makes an excellent ohmic contact to n-type InAlGaN. Above the device structure is shown a low resistivity host substrate 12 provided with first 24a and second 24b ohmic contacts to facilitate vertical conduction. A bonding layer 16a may be deposited on top of the first substrate ohmic contact A second bonding layer 16b is optionally deposited on top of the p-side ohmic contact 18 to facilitate a mechanically strong metallic wafer bond in a later step. In FIG. 4b, the host substrate is shown wafer bonded to the InAlGaN layers via the bonding layers. In FIG. 4c, the growth substrate 30 has been removed and ohmic contact 22 to the n-InAlGaN layers is provided. Then, mesas 32 are etched through the InAlGaN layers to define individual device active areas. In FIG. 4d, the host substrate has been diced to singulate individual InAlGaN light emitting devices. Silicon is preferred for the host substrate because it is easy to thin and saw into very small chips, and can have low electrical resistivity and high thermal conductivity compared to other common substrates. This method allows simple dicing of the InalGaN devices and avoids the problems associating with dicing sapphire. It is also possible to etch mesas prior to attaching the host substrate, rather than after removal of the growth substrate.

Having described the invention in detail, those skilled in the art will appreciate that, given the present disclosure, modifications may be made to the invention without departing from the spirit of the inventive concept described herein. Therefore, it is not intended that the scope of the invention be limited to the specific embodiments illustrated and described.

What is being claimed is:

1. A method of making a light-emitting device, the method comprising:

growing a III-nitride light-emitting structure on a growth substrate, the III-nitride light-emitting structure including a p-type layer, an n-type layer, and a light-emitting layer;

forming a first electrical contact on a side of the III-nitride light-emitting structure opposite the growth substrate, wherein the first electrical contact is reflective;

wafer bonding the III-nitride light-emitting structure to a host substrate;

after wafer bonding the III-nitride light-emitting structure to a host substrate, removing the growth substrate; and after removing the growth substrate, forming a second electrical contact on a side of the III-nitride light-emitting structure exposed by removal of the growth substrate.

2. The method of claim 1 further comprising:

forming a first electrical contact on a side of the III-nitride light-emitting structure opposite the growth substrate;

prior to removing the growth substrate, forming a first bonding layer on the first electrical contact; and forming a second bonding layer on the host substrate;

wherein wafer bonding the III-nitride light-emitting structure to a host substrate comprises wafer bonding the first bonding layer to the second bonding layer.

3. The method of claim 2 wherein at least one of the first bonding layer and second bonding layer is formed by a technique selected from a group including electron-beam evaporation, sputtering, and electroplating.

4. The method of claim 2 wherein the first bonding layer is selected from a group including silver, nickel, aluminum, gold, and cobalt.

5. The method of claim 1, wherein the first electrical contact is electrically connected to the p-type layer and the second electrical contact is electrically connected to the n-type layer.

6. The method of claim 2 wherein the first electrical contact comprises silver.

7. The method of claim 2 further comprising:

forming a first substrate electrical contact on a first side of the host substrate; and forming a second substrate electrical contact on a second side of the host substrate opposite the first side;

wherein the second bonding layer is deposited on the first substrate electrical contact.

8. The method of claim 1 further comprising:

etching mesas through the III-nitride light-emitting structure, the mesas defining individual light-emitting devices; and singulating the host substrate to form individual light-emitting devices.

9. The method of claim 8 wherein the mesas are etched after removing the growth substrate.

10. The method of claim 1 wherein the host substrate is selected from a group including metals and semiconductors.

11. The method of claim 1 wherein the host substrate is selected from a group including silicon, germanium, glass, copper, and gallium arsenide.

12. The method of claim 1 wherein removing the growth substrate comprises removing the growth substrate by a technique selected from a group including laser melting, mechanical polishing, and etching of a sacrificial layer grown on the substrate prior to growing the III-nitride light-emitting structure.

13. The method of claim 1 further comprising:

forming a first dielectric Bragg reflector mirror and a first electrical contact on a side of the III-nitride light-emitting structure opposite the growth substrate; after removing the growth substrate, forming a second dielectric Bragg reflector mirror on a side light-emitting structure exposed by removal of the growth substrate.

14. The method of claim 13 further comprising:

etching away a portion of the second dielectric Bragg reflector mirror to expose a portion of the III-nitride light-emitting structure;

forming a second electrical contact on the portion of the III-nitride light-emitting structure exposed by etching away a portion of the second dielectric Bragg reflector mirror.

* * * * *